United States Patent [19]

Hamanaka

[11] Patent Number: 5,202,567
[45] Date of Patent: Apr. 13, 1993

[54] OPTICAL INFORMATION TRANSMITTING DEVICE AND METHOD OF MANUFACTURING SAME

[75] Inventor: Kenjiro Hamanaka, Osaka, Japan

[73] Assignee: Nippon Sheet Glass Co., Ltd., Osaka, Japan

[21] Appl. No.: 764,005

[22] Filed: Sep. 23, 1991

[30] Foreign Application Priority Data

| Sep. 21, 1990 | [JP] | Japan | 2-253829 |
| Sep. 21, 1990 | [JP] | Japan | 2-253830 |
| Sep. 21, 1990 | [JP] | Japan | 2-253831 |
| Nov. 9, 1990 | [JP] | Japan | 2-304552 |
| Nov. 9, 1990 | [JP] | Japan | 2-304553 |
| Feb. 26, 1991 | [JP] | Japan | 3-053949 |
| Feb. 26, 1991 | [JP] | Japan | 3-053950 |
| Mar. 1, 1991 | [JP] | Japan | 3-059764 |

[51] Int. Cl.$^5$ ............................................. G02B 27/00
[52] U.S. Cl. ............................... 250/551; 250/208.2
[58] Field of Search ............... 250/216, 551, 208.2, 250/208.3, 208.4; 359/245, 250, 254, 259, 264, 152, 154, 164, 174, 179

[56] References Cited

U.S. PATENT DOCUMENTS

| 4,063,083 | 12/1977 | Cathey et al. | |
| 4,612,670 | 9/1986 | Henderson | 250/551 |
| 4,695,120 | 9/1987 | Holder | 250/551 |
| 4,720,634 | 1/1988 | D'Auria et al. | 250/551 |
| 4,892,376 | 1/1990 | Whitehouse | |
| 5,008,554 | 4/1991 | Asakawa et al. | 250/551 |

FOREIGN PATENT DOCUMENTS

0348329 12/1989 European Pat. Off.

OTHER PUBLICATIONS

Korth, "Optical Multichannel Connection of Integrated Modules", IBM Technical Disclosure Bulletin, vol. 18, No. 7, Dec. 1975, New York, U.S. p. 2187 (Exhibit A).
Dickinson et al., "Free-Space Optical Interconnection Scheme", Applied Optics, vol. 29, No. 14, May 10, 1990, New York, U.S. p. 2004, left column paragraphs 3–4 and FIG. 5 (Exhibit B).
*Optical Computing*, vol. 1359, published jointly by Steering Committee of 1990 International Topical Meeting on Optical Computing and the Japan Society of Applied Physics, printed in Japan, 1990, pp. 81–82, 160–166, 274–293, and 408–413 (papers 9D17, 10B2 through 10B4, 10H1 through 10H10, and 12B2).

*Primary Examiner*—David C. Nelms
*Attorney, Agent, or Firm*—Merchant, Gould, Smith, Edell, Welter & Schmidt

[57] ABSTRACT

An optical information transmitting device for transmitting information on a light beam emitted by a light source, includes an electronic circuit board, and an optical input/output port mounted on the electronic circuit board. The optical input/output port has a glass substrate attached to the electronic circuit board, a first array of optical sensors for absorbing a portion of a light beam applied thereto from the light source and photoelectrically converting the portion of the light beam, and for transmitting the remainder of the light beam therethrough, and a second array of spatial light modulators for modulating the transmittance with respect to a light beam applied thereto, the first and second arrays being disposed on a surface of the glass substrate in superposed relationship to each other. A motherboard comprises a substrate and a coaxial lens array of lenses spaced at equal intervals along an optical axis on the substrate, with conjugate focusing planes of equal magnification being disposed between adjacent ones of the lenses. A method of manufacturing the motherboard is also disclosed.

5 Claims, 15 Drawing Sheets

▨ .... TRANSMISSION-TYPE SLM

☐ .... TRANSMISSION-TYPE PHOTODETECTOR

1 TO 1

FOURIER FRANSFORM, INV-FOURIER TRANSFORM

1 TO m, m TO 1

MICROLENS ARRAY

REFLECTION

SHUFFLE

BEAM SHIFT PRISM

LD (LED) ARRAY

ROD LENS

PD ARRAY

ROD LENS

SLM (REFLECTION TYPE)

READ OUT    WRITE

SLM

ROD LENS

SLM (TRANSMISSION TYPE)

SLM (INPUT/OUTPUT TYPE)

PDs    LDs

NO COMPENSATION

DUMMY GLASS

SLM (TRANSMISSION TYPE)

GENERAL CASE

$\Sigma I/N = \text{CONST.}$

OPTICAL INFORMATION TRANSMITTING DEVICE AND METHOD OF MANUFACTURING SAME

BACKGROUND OF THE INVENTION

1. Field of the Invention

The present invention relates to the art of optical applications including optical information processing, optical computing, optical conversion, and optical measurement, and more particularly to board-to-board optical interconnections for optically interconnecting electronic circuit boards in computers or electronic devices.

2. Description of the Relevant Art

As electronic computer and semiconductor technology is rapidly advancing in recent years, the processing speed of central processing units (CPUs) is increasing and semiconductor memories are becoming higher in density and integration. At the same time, there have been certain limitations posed by the nature of electric circuitry itself on interchip interconnections, chip-to-chip interconnections, and board-to-board interconnections. Specifically, the phenomena of electric interference and electromagnetic induction present fundamental obstacles to efforts to design interconnections for higher density.

Optical information transmission, on the other hand, has a much greater possibility for higher-density interconnections as it is entirely free from the above problems.

In view of the advantages of optical information transmission, there have been various approaches to the development of optical interconnections. For details of one known attempt, reference should be made to *Conference Record of 1990 International Topical Meeting on Optical Computing*, pages 162, 164, and 408, for example.

FIGS. 21 and 22 of the accompanying drawings show a conventional board-to-board interconnection proposed in the above paper.

As shown in FIG. 21, sockets each having an array of light-emitting and -detecting elements are mounted on a glass substrate (motherboard), and electronic circuit boards are connected to the glass substrate through the sockets. As shown in FIG. 22, light is propagated along a zigzag path in the glass substrate, allowing a signal to be transmitted from one socket another. The light-emitting and -detecting elements are optically coupled to the propagated light through a hologram element (HOE). The hologram element includes focusing lenses and a mirror or beam splitter to prevent the light from being spread due to diffraction when it is propagated along the zigzag path in the glass substrate.

The conventional board-to-board interconnection can be manufactured by the planar fabrication process because all the optical devices can be mounted on the glass substrate. However, it is highly difficult to reduce the aberration of the HOE lenses particularly for the reason that they focus the light off-axis, and the hologram element tends to produce unwanted diffracted light as noise.

Accordingly, the above prior optical signal transmission arrangement makes it difficult to achieve optical interconnection for higher resolution with good signal-to-noise ratio, or higher density.

Other problems are that inasmuch as the light is propagated along the zigzag path in the glass substrate, the glass substrate should have parallel surfaces with high precision, it is difficult to shorten the total length of the propagation path, and the time lag between the electronic circuit boards, such as a clock skew, is possibly not negligible.

Generally, an optical system comprising lenses, gratings, prisms, etc. suffers a drawback in that it requires an extremely complex process to align the optical axes of the optical components used. It is very difficult to position, highly accurately, various optical parts or optoelectronic parts, e.g., a spatial light modulator (SLM), a detector array, an light-emitting-diode (LED) array, a semiconductor laser (LD) array, etc., with respect to each other.

Furthermore, since mechanisms for aligning/fixing these parts are complicated, the entire optical system cannot be greatly reduced in size, and the positional stability or reliability of the assembled parts against temperature changes or other environmental changes cannot be maintained at a desired level.

Recent years have seen frequent exchanges of optical information between a plurality of parallel optical paths (see, for example, *Conference Record* of 1990 *International Topical Meeting on Optical Computing*, No. 10B2, 9D17, 10 Hz).

SUMMARY OF THE INVENTION

According to the present invention, there is provided an optical information transmitting device for transmitting information on a light beam emitted by a light source, comprising an electronic circuit board, and an optical input/output port mounted on the electronic circuit board, the optical input/output port comprising a glass substrate attached to the electronic circuit board, a first array of optical sensors for absorbing a portion of a light beam applied thereto from the light source and photoelectrically converting the portion of the light beam, and for transmitting the remainder of the light beam therethrough, and a second array of spatial light modulators for modulating the transmittance with respect to a light beam applied thereto, the first and second arrays being disposed on a surface of the glass substrate in superposed relationship to each other.

The transparent optical sensor array, which is mounted on a glass substrate, absorbs a portion of applied light and transmits the remainder of the applied light. Optical information that has been supplied through optical communication is applied by the optical sensor array to a circuit board. The transmission-type spatial light modulator array, which is also mounted on the glass substrate, modulates a light beam propagated through the glass substrate with information, and outputs the information from the circuit board.

A plurality of electronic circuit boards each with the above optical input/output port are arranged with the optical input/output ports being held in confronting relationship. When a collimated light beam such as a laser beam is applied to the optical input/output ports, the electronic circuit boards are optically coupled by a board-to-board optical interconnection.

A coaxial lens array of lenses is spaced at equal intervals along an optical axis on a substrate, with conjugate focusing planes of equal magnification being disposed between adjacent ones of the lenses. The coaxial lens array is arranged such that light emitted by a light source along the optical axis reaches the conjugate focusing planes, successively. The coaxial lens array thus forms a number of successive conjugate focusing planes, providing a bidirectional focusing network of the focusing focusing planes. When a transmissive two-dimensional optical pattern is provided in one of the conjugate focusing planes, the information of the two-dimensional optical pattern can be transmitted to all the other conjugate focusing planes.

According to the present invention, there is also provided an optical system for transmitting optical information between a plurality of parallel optical paths.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
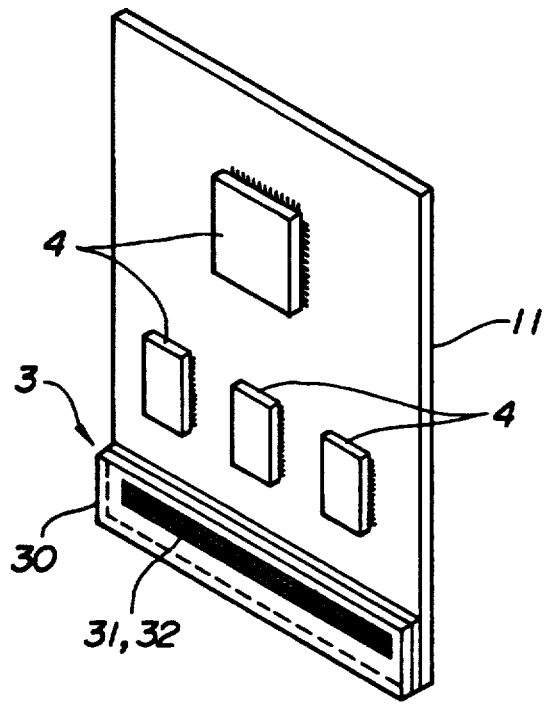
FIG. 1 is a perspective view of an electronic circuit board having an optical information input/output port according to the present invention.

An electronic circuit board having an optical information input/output port according to the present invention will be described below with reference to FIGS. 1 and 2.

An electronic circuit board 11 has an opening 11a defined in one end thereof. An optical input/output port 3 comprising at least two (three in the illustrated embodiment) superposed transparent glass substrates 30 is fixedly mounted on one side of the electronic circuit board 11 in covering relation to the opening 11a. One of the glass substrates 30 supports on one surface a transparent optical sensor array 31, and another of the other glass substrates 30 supports on one surface, or said one glass substrate 30 supports on its opposite surface, a transmission-type spatial light modulator (SLM) array 32. The glass substrates 30, the optical sensor array 31, and the transmission-type SLM array 32 jointly serve as an optical input/output port 3. The exposed outer surfaces of the glass substrates 30 are coated with an antireflection film (not shown).

The optical sensor array 31 comprises a plurality of optical sensor elements for absorbing and photoelectrically converting several % of applied light into an electric signal to detect the intensity of the applied light, and for transmitting the remainder of the applied light therethrough. The transmission-type SLM array 32 comprises a plurality of SLM elements (pixels) for modulating the transmittance with respect to the applied light.

The optical sensor array 31 and the transmission-type SLM array 32 are arranged in a plane normal to the applied light A (FIG. 2), with the optical sensor elements and the SLM elements being aligned with each other in one-to-one correspondence. The information borne by the applied light A is detected by the optical sensor array 31, and supplied to electronic circuits 4 on the electronic circuit board 11. Transmitted light A' that has been modulated by the transmission SLM array 32 based on a signal from the electronic circuits 4 is applied to another electronic circuit board (not shown in FIGS. 1 and 2).

The optical sensor array 31 is in the form of an amorphous silicon detector array that may be fabricated as a patterned film of amorphous silicon or polysilicon on the glass substrate 30. The light absorptivity and transmittance of the optical sensor array 31 can be selected depending on the film thickness thereof.

The transmission-type SLM array 32 may be formed of a ferrodielectric liquid crystal or the like, and should be combined with a polarizer film if it is to modulate the intensity of the applied light.

The applied light A may, for example, be a collimated laser beam emitted by a semiconductor laser.

Figure 2:
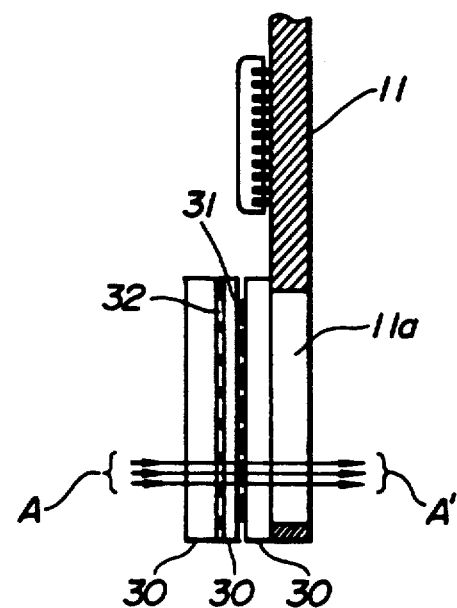
FIG. 2 is an enlarged fragmentary cross-sectional view of the electronic circuit board showing in FIG. 1, the view being taken along an optical path.
Figure 3:
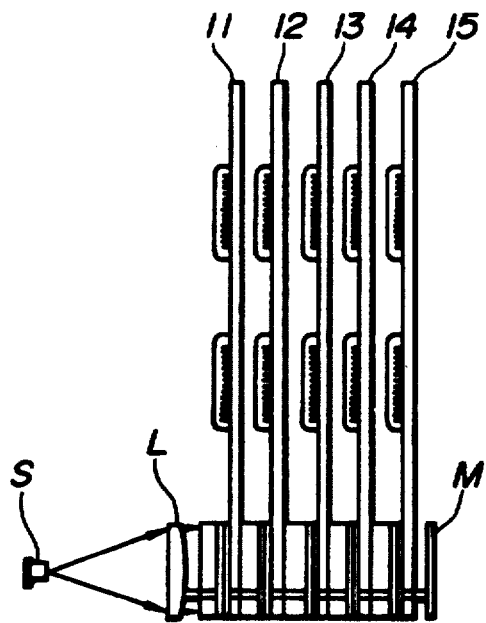
FIG. 3 is a cross-sectional view of an optical information transmitting device which comprises electronic circuit boards shown in FIG. 1.

FIG. 3 shows an optical information transmitting device which comprises an array of electronic circuit boards 11 through 15 each having the optical input/output port 3 as shown in FIGS. 1 and 2, the optical input/output ports 3 being arranged along an optical path for optically interconnecting the electronic circuit boards 11 through 15.

The optical input/output ports 3 of the electronic circuit boards 11 through 15 are superposed in mutually confronting relationship. A laser beam is emitted by a light source S comprising a semiconductor laser (LD) disposed on one side of the optical information transmitting device, and is then collimated by a collimator lens L. The collimated laser beam is applied to and transmitted through the optical input/output ports 3, and then reflected by a mirror M disposed on the other side of the optical information transmitting device. Therefore, the laser beam travels to and fro through the electronic circuit boards 11 through 15.

To transmit a signal from the board 13 to the other boards, for example, the collimated laser beam is modulated in intensity or phase by the transmission-type SLM array 32 of the board 13, and the modulated laser beam is transmitted from the board 13 successively to the board 14, the board 15, the mirror M, the board 15, the board 14, the board 13, the board 12, and the board 11. Therefore the modulated laser beam is detected successively by the optical sensor arrays 31 of all the boards.

If different SLM elements or pixels are used to modulate the collimated laser beam, then different electronic circuit boards may simultaneously be talkers or signal transmitting boards. If the light absorptivity of each of the optical sensor arrays 31 is about 2%, for example, then the intensity of the laser beam transmitted through an array of twenty electronic circuit boards, for example, is:

$$(1-0.02)^{20\times 2}=0.45$$

and hence a sufficient beam intensity can be obtained at any electronic circuit board.

An optical information transmitting device according to another embodiment of the present invention will be described below with reference to FIGS. 4 and 5.

Figure 4:
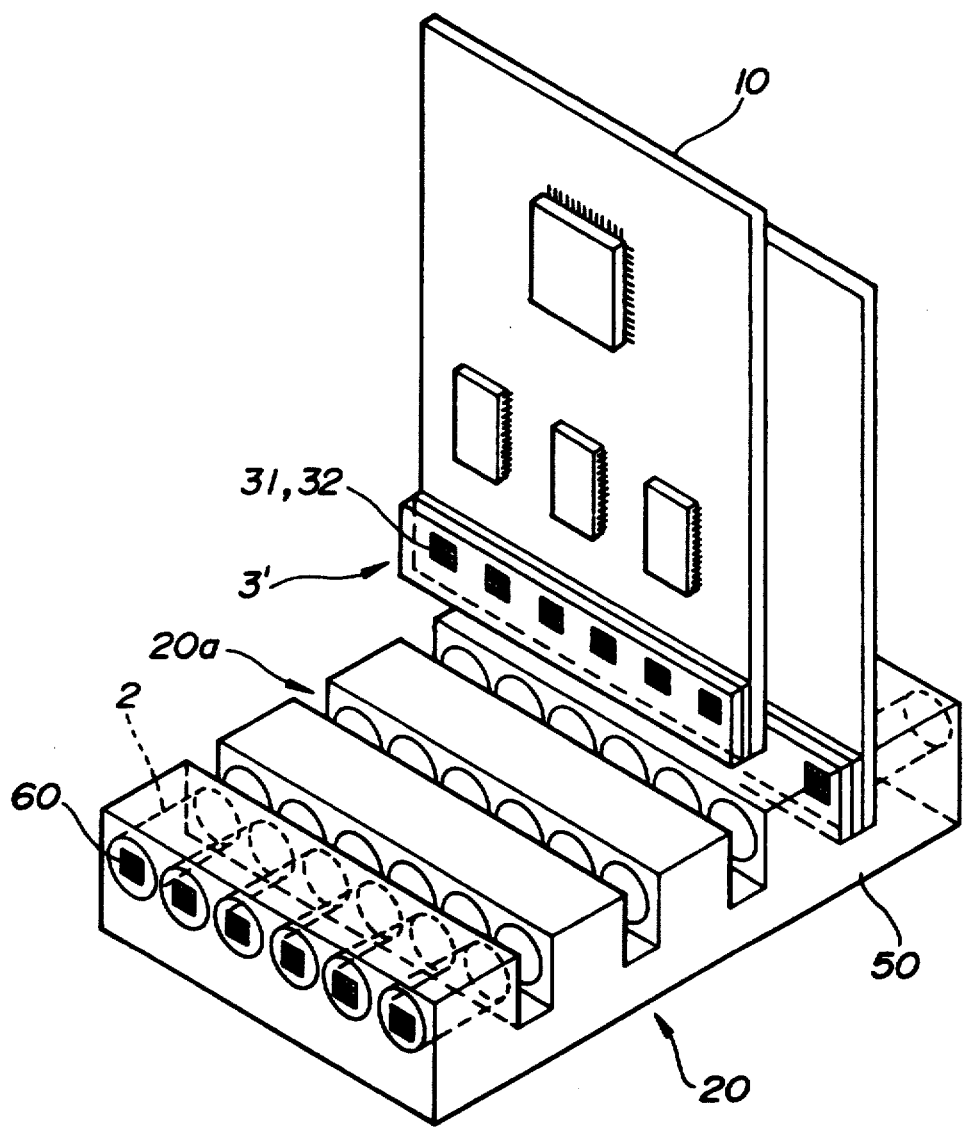
FIG. 4 is a perspective view of an optical information transmitting device according to another embodiment of the present invention.

As shown in FIG. 4, a motherboard 20 comprises a substrate 20 made of glass, ceramic, or plastic, and a plurality of spaced rows of distributed-index rod lenses 2 that are fixedly mounted in the substrate 20. As shown in FIG. 5, the opposite ends (i.e., light entrance and exit ends) of each of the rod lenses 2 comprise flat surface lying parallel to each other perpendicularly to an optical axis 2A.

The motherboard 20 has a plurality of straight slots 20a defined between the spaced rows of distributed-index rod lenses 2, for receiving a plurality of respective electronic circuit boards 10. The electronic circuit boards 10 have respective optical input/output ports 3' inserted in the slots 20a for transmitting optical information between the electronic circuit boards 10. Each of the optical input/output ports 3' comprises a plurality of photodetector or optical sensor arrays 31 and a plurality of transmission-type SLM arrays 32.

Figure 5:
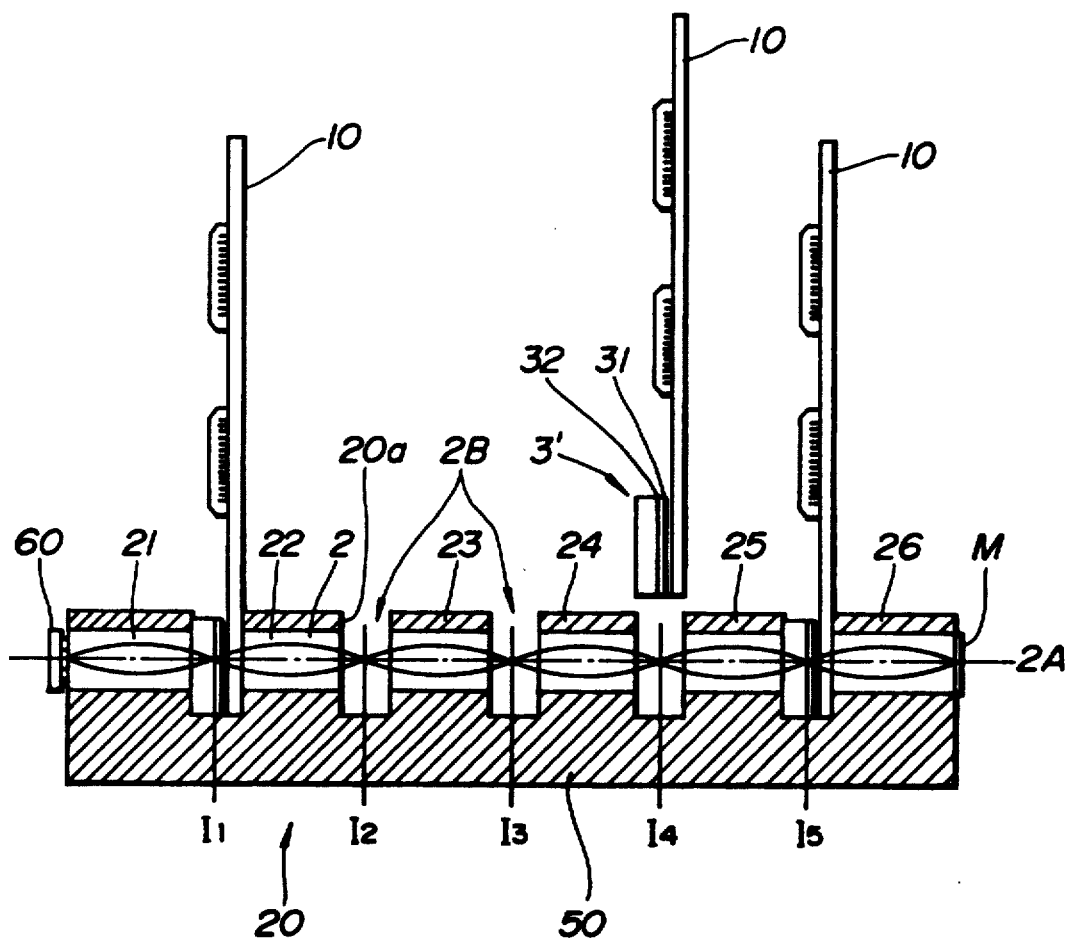
FIG. 5 is a cross-sectional view of the optical information transmitting device shown in FIG. 4, the view being taken along an optical path.

As illustrated in FIG. 5, the distributed-index rod lenses 2 are arranged in coaxial arrays (only one shown) each composed of distributed-index rod lenses 2 spaced at equal intervals along the optical axis 2A, which is common to these rod lenses 2. As shown in FIG. 4, the arrays of distributed-index rod lenses 2 are juxtaposed in a direction normal to their optical axes 2A that extend parallel to each other.

Each of the rod lenses 2 comprises a transparent cylindrical lens that may be produced by effecting an ion exchange on a cylindrical rod of glass. The rod lens 2 has a distribution of refractive indexes that is rotationally symmetric with respect to the central axis of the cylindrical rod. Specifically, the refractive index is maximum at the central axis and is progressively reduced substantially parabolically radially outwardly. The parabolic refractive index profile allows the rod lens to act as a convex lens to bend the light beam radially inwardly within the rod lens.

Images formed by the coaxial array of rod lenses 2 will be described below.

With each of the rod lenses 2 being of a suitable length, the rod lenses 2 serve as an unmagnified ($-1$ magnification) image focusing system. Each of the rod lenses 2 of the unmagnified image focusing system forms an unmagnified focused image, and the distances between the rod lenses 2 are adjusted and fixed such that the rod lenses 2 have successively superposed conjugate focusing planes I1, I2, I3, I4, I5.

More specifically, as shown in FIG. 5, a first rod lens 21 has an image plane I1 that doubles as an object plane of a second rod lens 22, and the second rod lens 22 has an image plane I2 that doubles as an object plane of a third rod lens 23. In this manner, coaxially arrayed rod lenses 21 through 26 have successively superposed conjugate focusing planes.

Therefore, the conjugate focusing planes I1, I2, ... I5 are positioned in respective gaps 2B between the ends of the rod lenses 2.

Insofar as the light is applied to and transmitted from the optical input/output ports 3' at the conjugate focusing planes, the applied light need not be a collimated laser beam, but may be light emitted by a light-emitting diode (LED) array. Even if the pixels of the transmission-type SLM array 32 are reduced in size or the distance over which the light is transmitted through the optical information transmitting device is increased, the resolution is prevented from being lowered due to diffraction.

An LED array 60 is held in intimate contact with one end of the coaxial rod lens array, and a mirror M is held against the other end of the coaxial rod lens array.

An unmagnified image from the LED array 60 is formed in the plane I1 by the first rod lens 21, and the image in the plane I1 is transmitted by the second rod lens 22 successively to the rod lenses 23, 24, 25. After the image is transmitted through the final rod lens 26, it is then reflected by the mirror M and transmitted back through the planes I5, I4, I3, I2, I1.

Therefore, the image from the LED array 60 is transmitted from the plane I1 to the plane I2 to the plane I3 to the plane I4 to the plane I5 to the mirror M and back to the plane I5 to the plane I4 to the plane I3 to the plane I2 to the plane I1.

The image from the LED array 60 is thus simultaneously transmitted to the conjugate focusing planes I1, I2, I3, I4, I5. If a suitable optical pattern is formed in any one of the conjugate focusing planes I1, I2, I3, I4, I5, the optical pattern is transmitted to the other conjugate focusing planes.

It is assumed that the direction in which the light travels from the LED array 60 to the plane I1 to the plane I2 to the plane I3 to the plane I4 to the plane I5 to the mirror M is referred to as a "forward direction", and the direction in which the light travels from the mirror M to the plane I5 to the plane I4 to the plane I3 to the plane I2 to the plane I1 is referred to as a "reverse direction." It is also assumed that the conjugate focusing planes formed by the light travelling in the forward direction are denoted by I+1, I+2, I+3, I+4, I+5, respectively, and the conjugate focusing planes formed by the light travelling in the forward direction are denoted by I−5, I−4, I−3, I−2, I−1, respectively.

The conjugate focusing planes I+1 and I−1, I+2 and I−2, I+3 and I−3, I+4 and I−4, I+5 and I−5 are in the same positions, respectively, and the conjugate images on these planes I+1 and I−1, I+2 and I−2, I+3 and I−3, I+4 and I−4, I+5 and I−5 are inverted with respect to each other.

Figure 6A:
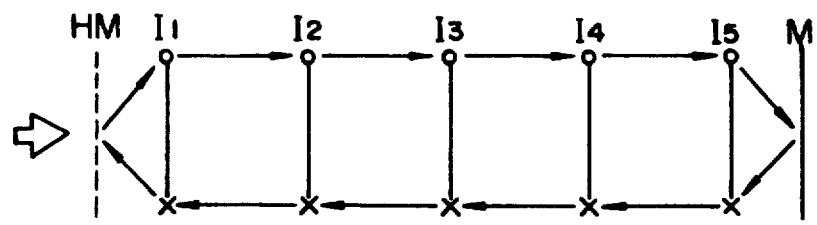
FIGS. 6a through 6c are diagrams of optical paths, showing erect and inverted conjugate images in forward and reverse directions.
Figure 6B:
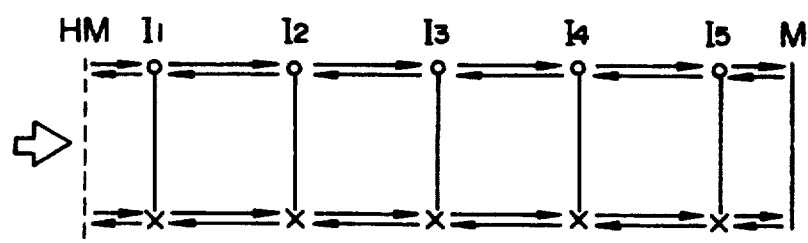
Figure 6C:
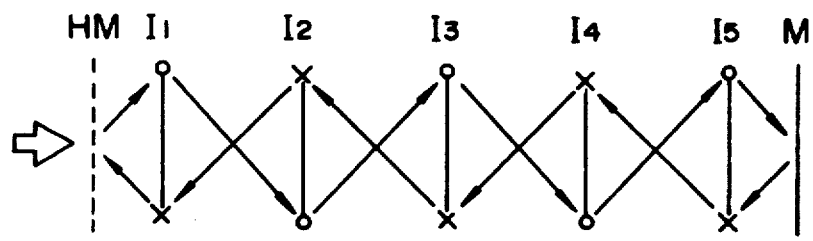

The reason why these conjugate images in the forward and reverse directions are inverted with respect to each other will be described below with reference to FIGS. 6a through 6c. FIGS. 6a and 6c schematically show optical paths that make the conjugate images in the forward and reverse directions reverse with respect to each other, and FIG. 6b schematically shows optical paths that make the conjugate images in the forward and reverse directions identical to each other. Denoted at HM is a half-silvered mirror and M a mirror.

The optical input/output ports each having the transmission-type SLM array 32 and the transmission-type photodetector or optical sensor array 31 are disposed in the respective conjugate focusing planes I1 through I5. Some of the SLM elements or pixels of the SLM array 32 in the conjugate focusing plane I3 are turned off not to transmit light therethrough, thereby displaying a suitable optical pattern.

Figure 7A:
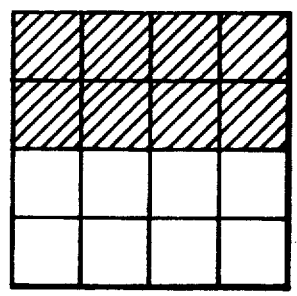
FIGS. 7a and 7b are diagrams showing arrays of transmission-type SLMs and photodetector.
Figure 7B:
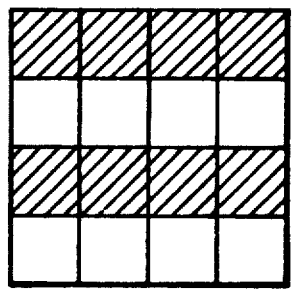

In this embodiment, the SLM arrays 32 and the photodetector arrays 31 are arranged such that they are not superposed in all the conjugate focusing planes, as shown in FIGS. 7a or 7b. If the conjugate images in the forward and reverse directions are inverted with respect to each other as shown in FIGS. 6a and 6c, then since the optical paths are inverted in the forward and reverse directions, the optical pattern displayed by the SLM array 32 in the conjugate focusing plane I3 is transmitted through the conjugate focusing planes in the following sequence:

I3→I4→I5→M→I5→I4→I3→I2→I1, so that the optical pattern can be transmitted to all the conjugate focusing planes.

However, if the conjugate images in the forward and reverse directions are not inverted with respect to each other as shown in FIG. 6b, then since the optical paths are overlapped in the forward and reverse directions, the optical pattern that is displayed by the SLM array 32 in the conjugate focusing plane I3 when the selected SLM elements are turned off is transmitted through the conjugate focusing planes in the following sequence:

I3→I4→I5→M→I5→I4→I3, and then blocked by the SLM array 32 in the conjugate focusing plane I3. Therefore, the optical pattern cannot be transmitted to the conjugate focusing planes I2, I1.

Therefore, since the conjugate images in the forward and reverse directions are inverted with respect to each other and the SLM arrays and the photodetector arrays are not superposed in all the conjugate focusing planes, as shown in FIGS. 7a and 7b, all the conjugate focusing planes can be optically interconnected for transmitting optical information therebetween.

When optical patterns are simultaneously displayed by the SLM arrays in two or more conjugate focusing planes, such optical patterns cannot be transmitted to some of the other focus planes. However, the "bus" of a computer is usually required to receive a signal from one signal source and transmit the signal to all input/output ports at one time. Therefore, the optical information transmitting device according to this embodiment is effective enough to function as a computer "bus."

Any information that is produced as an optical image or pattern by the LED array 60 can be transmitted to all the focus planes I1 through I5. This mode of optical information transmission may be used to distribute a clock signal to the electronic circuit boards. Furthermore, a two-dimensional transmissive optical pattern that is displayed in a desired one of the focus planes I1 through I5 can also be transmitted to all the other planes. This mode of optical information transmission may be used to provide a bus interconnecting the electronic circuit boards.

Since the coaxial lens arrays are juxtaposed in a direction across the optical axes thereof in the mother-board 20 as shown in FIG. 4, the coaxial lens arrays may independently be used to transmit a large quantity of optical information.

In this embodiment, the optical input/output port 3' at the end of each of the electronic circuit boards 10 mounted on the motherboard 20 has as many transmission-type SLM arrays 32 and as many optical sensor arrays 31 as the number of the coaxial lens arrays. When the optical input/output ports 3' are inserted in the respective slots 20a, the transmission-type SLM arrays 32 and the optical sensor arrays 31 are positioned in the conjugate focusing planes, respectively, between the rod lenses 2.

With the electronic circuit boards 10 mounted in the respective focus planes I1 through I5, optical pattern information produced by the transmission-type SLM array 32 of any one of the electronic circuit boards 10 can be detected by the optical sensor arrays 31 of all the other electronic circuit boards 10 substantially at the same time. Optical pattern information emitted by the LED array 60 can also be detected substantially simultaneously by the electronic circuit boards 10. The optical information transmitting device according to this embodiment therefore allows the electronic circuit boards 10 to detect optical information emitted by the LED array 60 and also to transmit optical information to be transmitted therebetween.

If each of the rod lenses 2 has a diameter of 3 mm, for example, then a matrix of 200×200 pixels each being of a square shape whose side is about 10 μm long may be placed in an area that is about 60 to 70% of the area of a circular shape, 3 mm across, corresponding to the cross section of the rod lens. When the LED array 60, the transmission-type SLM array 32, and the transparent optical sensor 31 are composed of such a matrix of elements, the optical information transmitting device provides large-scale board-to-board interconnections.

The motherboard 20 shown in FIGS. 4 and 5 may be manufactured by joining, at suitable intervals along the optical axis, a plurality of lens array plates (manufactured by Nippon Sheet Glass Co., Ltd. and sold under the trade name "SELFOC LENS ARRAY (SLA)) each having a row of closely spaced rod lenses with parallel optical axes. The SLA is generally an erect-image focusing system, i.e., a +1 unmagnified focusing system (the optical system shown in FIG. 1 is a −1 unmagnified focusing system). It is apparent that the +1 unmagnified focusing system offers practical advantages.

The spaced SLAs that are joined have flat opposite ends, and the gaps between the flat ends of the spaced SLAs are used as slots for receiving the electronic circuit boards 10. Therefore, the electronic circuit boards 10 may simply be mounted on the motherboard 20 without the need for any special holders or installing tools.

Figure 8:
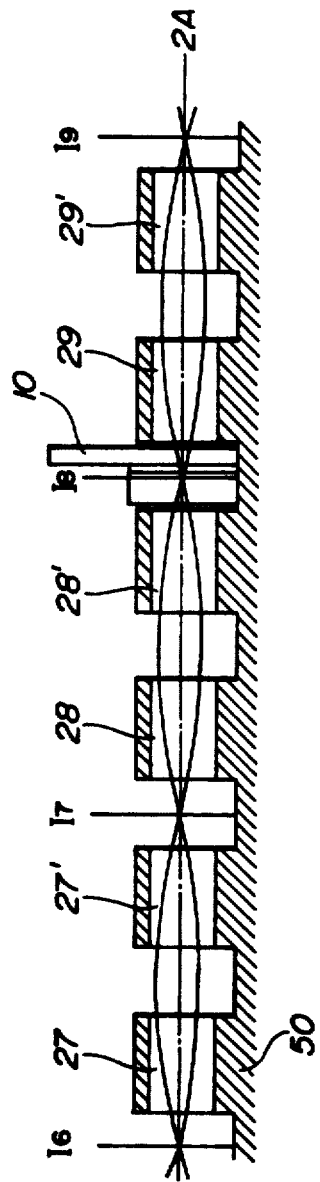
FIG. 8 is a sectional side elevational view of an array of coaxial lenses according to another embodiment of the present invention.

In the embodiment shown in FIGS. 4 and 5, one rod lens constitute a −1 unmagnified focusing system. Actually, however, as shown in FIG. 8, pairs of rod lenses 27 and 27', 28 and 28', and 29 and 29' are employed, each rod lens pair serving as a −1 unmagnified focusing system. Fourier transform planes are positioned between the rod lenses 27 and 27', 28 and 28', and 29 and 29'. This arrangement is suitable to provide conjugate focusing planes using an array of coupled rod lenses.

Figure 9A:
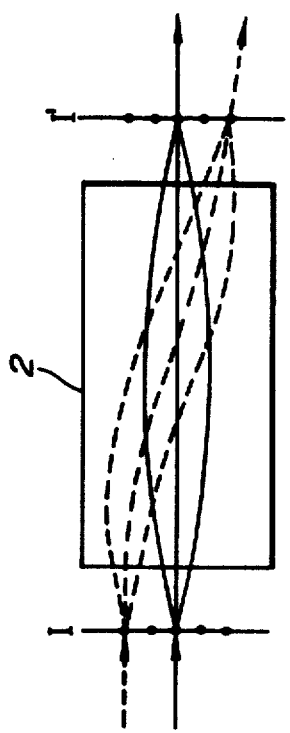
FIGS. 9a and 9b are sectional side elevational views illustrative of an advantage of the coaxial lens array shown in FIG. 8.
Figure 9B:
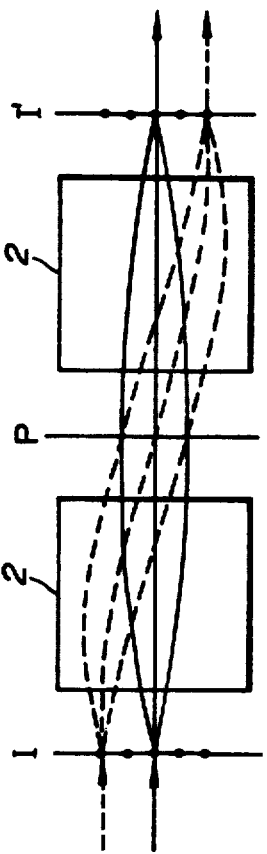

If one rod lens is used to provide a −1 unmagnified focusing system, then principal rays of off-axis light are not parallel to the optical axis at an image plane I' as indicated by the dotted lines in FIG. 9a. If a pair of collimators is used provide a −1 unmagnified focusing system, then principal rays are parallel to the optical axis with respect to all object points at the image plane I' as shown in FIG. 9b. The arrangement shown in FIG. 9a is preferable for a cascaded connection of focusing systems.

Since the conjugate focusing planes and the Fourier transform planes are positioned alternately between the rod lenses, the electronic circuit boards 10 are disposed in the gaps where the conjugate focusing planes I6 through I9 are defined. The Fourier transform planes are conjugate with respect to each other.

In FIG. 9b, each of the lenses 2 may not necessarily be a distributed-index rod lens, but may be a spherical lens or an aspherical lens insofar as a substantial aperture plane P is provided centrally in the lens system, and infinite lens systems are disposed symmetrically in front of and behind the lens system, thus providing a telecentric optical system with respect to both object and image planes I, I'. Such an optical system renders all principal rays of off-axis light parallel to the optical axis at the object and image planes.

The light source, which is shown as the LED arrays 60 in FIGS. 4 and 5, may be semiconductor laser (LD) arrays instead, or may be a surface light source for emitting coherent or incoherent light.

An optical information transmitting device with two light sources according to still another embodiment of the present invention will be described below with reference to FIG. 10.

Figure 10:
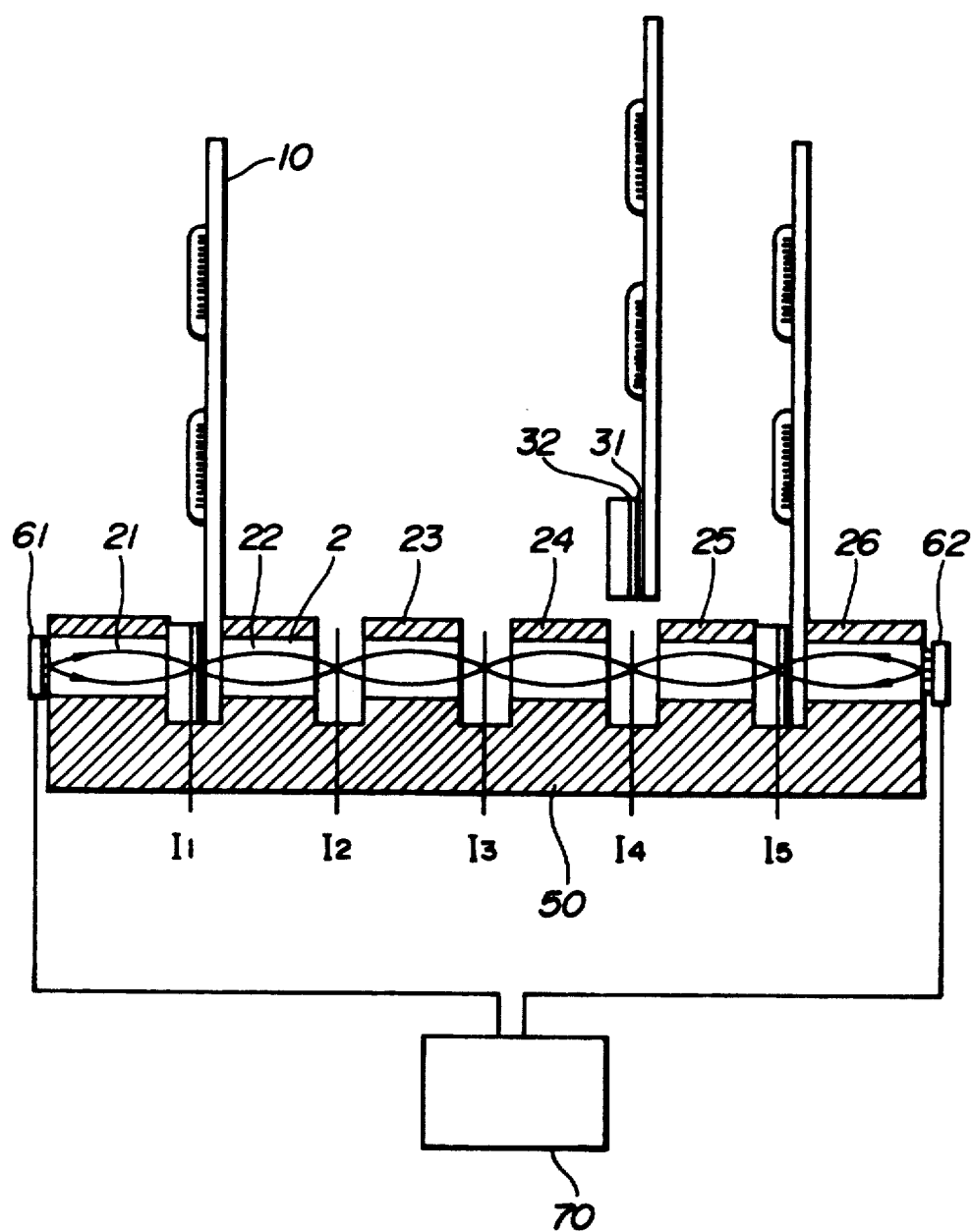
FIG. 10 is a cross-sectional view of an optical information transmitting device according to still another embodiment of the present invention.

In the embodiment shown in FIG. 10, two LED arrays 61, 62 are held closely against the opposite ends, respectively, of each coaxial lens array.

An unmagnified image emitted by the LED array 61 is formed in the conjugate focusing plane I1 by the first rod lens 21, is transmitted to the conjugate focusing plane I2 by the second rod lens 22, and is similarly transmitted successively to the conjugate focusing planes I3, I4, I5. Likewise, an unmagnified image emitted by the other LED array 62 is transmitted successively to the conjugate focusing planes I5, I4, I3, I2, I1.

The LED arrays 61, 62 are energized and de-energized under the control of a common controller 70 such that the LED arrays 61, 62 are supplied with identical information, i.e., an identical modulated signal or an identical optical pattern. The image from the LED array 61 that is formed in each of the conjugate focusing planes I1 through I5 and the image from the LED array 62 that is formed in each of the conjugate focusing planes I1 through I5 are identical to each other, and exactly superposed on each other.

Therefore, when some information is displayed by the LED arrays 61, 62, it is transmitted to all the conjugate focusing planes I1 through I5. When a two-dimensional optical pattern is displayed in any one of the conjugate focusing planes I1 through I5, the optical pattern is transmitted to all other conjugate focusing planes. Thus, optical information can freely be outputted from and inputted to, i.e., exchanged between, the conjugate focusing planes.

A method of fabricating the motherboards of the optical information transmitting devices described above will be described below with reference to FIGS. 11a, 11b, and 12.

A lower substrate 52 is made of glass or ceramic and has parallel straight grooves 52a defined in an upper surface thereof. Distributed-index rod lens blanks 2C each having the same length as that of the lower substrate 52 are placed respectively in the grooves 52a, with the ends of the rod lens blanks 2C lying flush with each other.

The grooves 52a may be defined by cutting the lower substrate 52 with a diamond blade on a slicing machine, or etching the lower substrate 52 using a mask having stripe openings. Alternatively, the lower substrate 52 may be grooved with a wire coated with abrasive grain of diamond.

Figure 11A:
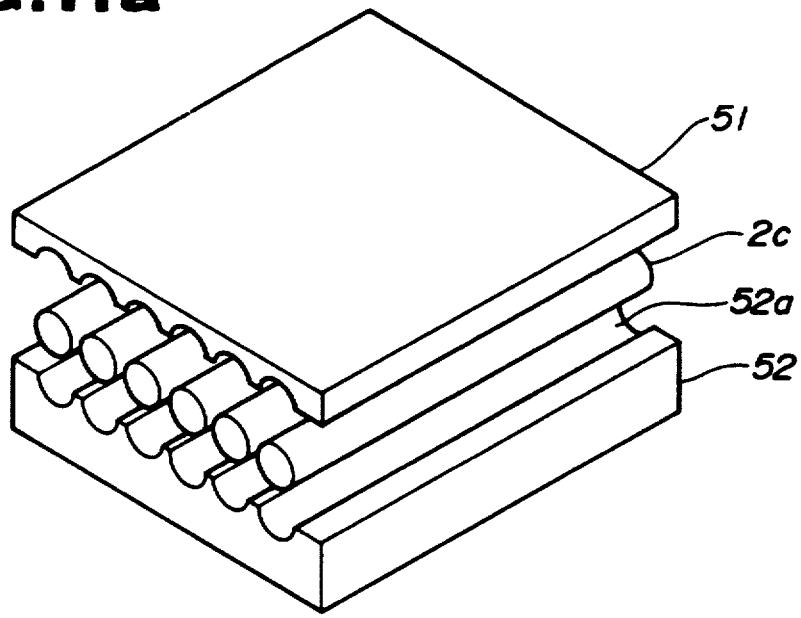
FIG. 11a is a perspective view illustrative of a first step of a method of fabricating a motherboard.
Figure 11B:
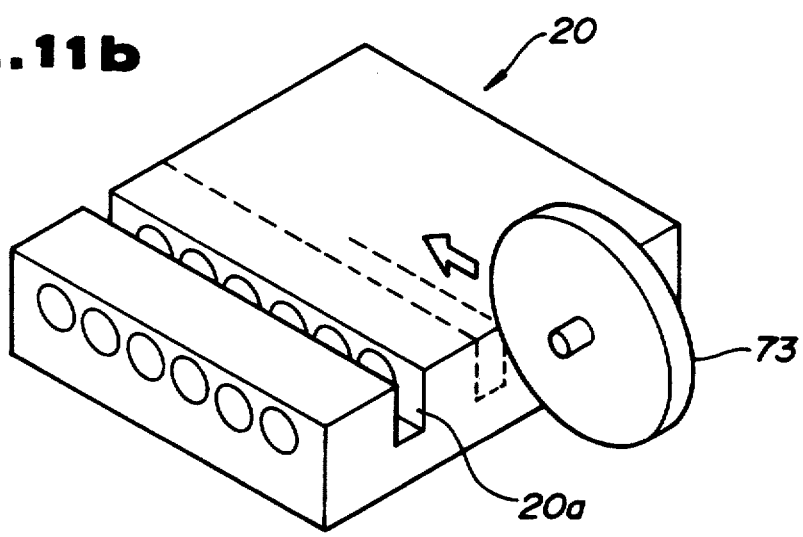
FIG. 11b is a perspective view illustrative of a second step of the method of fabricating a motherboard.
Figure 12:
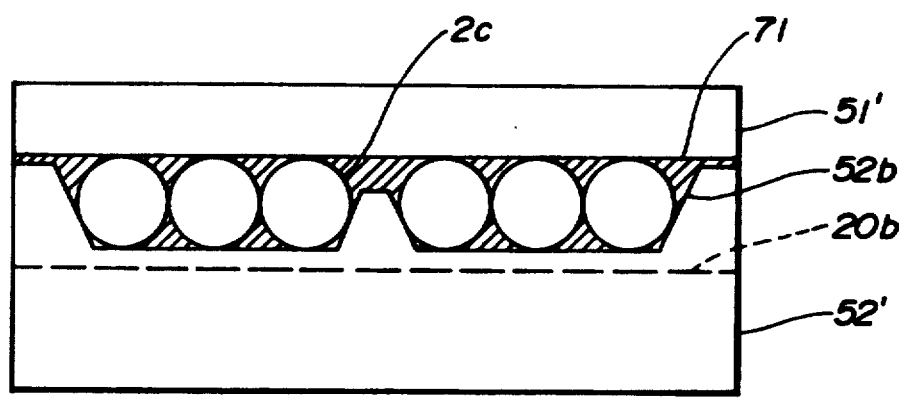
FIG. 12 is a cross-sectional view of another motherboard.

In FIG. 11a, the lower substrate 52 has as many grooves 52a as the number of the rod lens blanks 2A. However, as shown in FIG. 12, a lower substrate 52' may have grooves 52b each wide enough to receive a plurality of rod lens blanks 2C. Before the rod lens blanks 2C are placed in the grooves 52a or 52b, an adhesive resin material 71 for bonding the rod lens blanks 2C is poured into the grooves 52a or 52b.

After the rod lens blanks 2C are placed in the grooves 52a or 52b, the same adhesive resin material is poured again, and an upper substrate 51 (FIG. 11a) is placed on the rod lens blanks 2C, pressing them toward the lower substrate 52 while allowing the adhesive resin material 71 to be solidified. The adhesive resin material 71 may be filled around the rod lens blanks 2C after they have been sandwiched between the upper and lower substrates 51, 52. The upper substrate 51 may have grooves for receiving the rod lens blanks 2C as shown in FIG. 11a, or may not have such grooves.

The adhesive resin material 71 to be filled may comprise a thermosetting resin material, a thermoplastic resin material, a photosetting resin material, or the like. If the photosetting resin material is used, the substrates 51, 52 should be of a transparent material that allows light to be applied therethrough to photoset the photosetting resin material.

Depending on applications, i.e., depending on the manner in which light is applied to the rod lenses, a black resin material of high light absorptivity should preferably be filled around the rod lens blanks, or the outer surfaces of the rod lens blanks should preferably be coated with a black coating layer.

The above process will be referred to as a first process.

Then, the bonded structure of the substrates 51, 52 and the rod lens blanks 2C is cut by a rotating diamond blade 73 on a slicing machine in a direction normal to the axes of the rod lens blanks 2C, thereby defining slots 20a for receiving electronic circuit boards. The slots 20a are positioned such that they divide the rod lens blanks 2C into rod lenses 2 of predetermined length as shown in FIGS. 4 and 5. The grooves 20a have respective bottom surfaces which are indicated at 20b in FIG. 12.

The particle diameter of the diamond abrasive grain of the blade 73, the rotational speed of the blade 73, and the feed speed of the blade 73 are suitably selected to give the surfaces of the cut grooves a mirror finish. If the blade 73 has a thickness smaller than the width of a groove to be cut, then opposite sides of the slot should be cut to a mirror finish by a diamond blade of finer abrasive grain, and thereafter the central region of the slot should be ground off by a diamond blade of rougher abrasive grain at higher speed. This process using different blades of different abrasive grains gives rise to a higher rate of production.

If the blade 73 fails to achieve a mirror finish for a slot, then after the slot has been cut, then a transparent rein film having a refractive index close to that of the rod lens blanks 2C should be coated on each of the opposite ends of the rod lens, e.g., by dipping and subsequent squeezing. In this manner, optical matching is achieved to provide the rod lenses with flat surfaces that are virtually of a mirror finish.

In this process, the slots 20a are spaced at equal intervals along the axes of the rod lenses, and have equal widths.

The slots 20a are positioned relatively to each other such that if there is an object plane in at least one of the slots, then an image plane that is in optically conjugate relationship to the object plane is positioned in at least other one of the slots. Furthermore, the slots 20a are disposed such that all conjugate focusing planes are positioned in equal locations in the slots, respectively.

The above process will be referred to as a second process.

The motherboard shown in FIGS. 4 and 5 is fabricated according to the first and second processes.

Before or after the first process, at least one end of each of the rod lens blanks 2C has a reflecting surface in the form of a reflecting coating film or a reflecting mirror securely attached thereto. A light source is held against or positioned closely to the other end of each of the rod lens blanks 2C.

With the motherboard thus fabricated, the individual rod lenses are coaxially aligned with each other in one coaxial lens array with high precision. The rod lenses are positioned in coaxial arrays highly accurately since the substrate has guide grooves to position the rod lenses.

Figure 13:
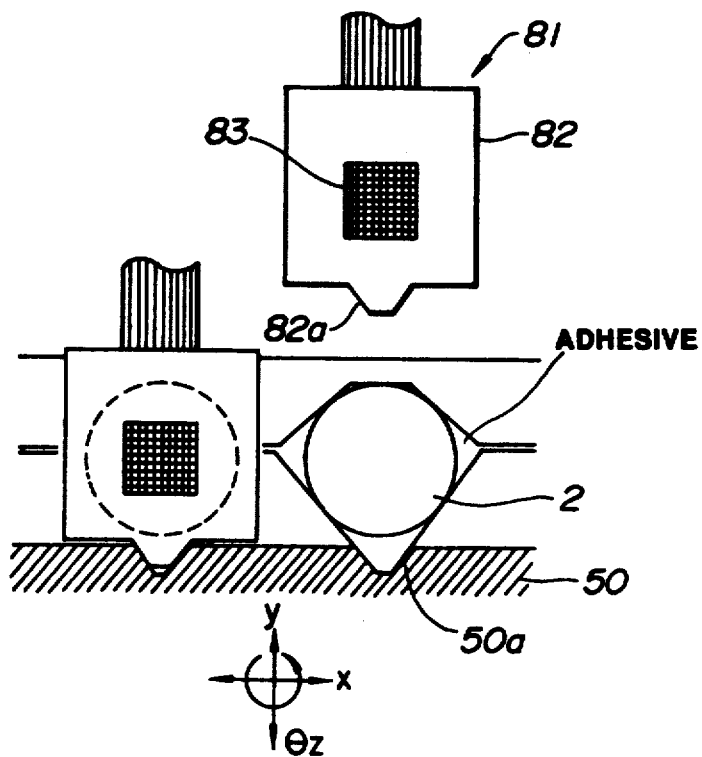
FIG. 13 is a sectional front elevational view showing the manner in which an optical/optoelectronic component is mounted on the motherboard.
Figure 14:
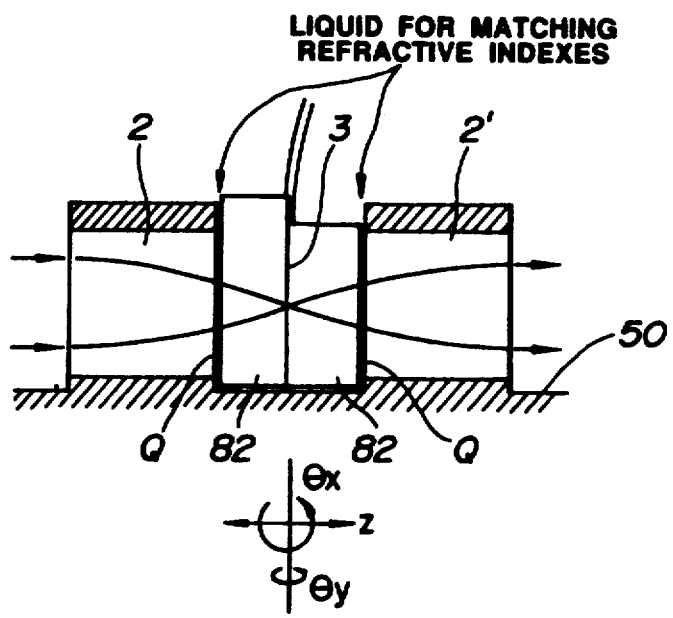
FIG. 14 is a sectional side elevational view of the arrangement shown in FIG. 11.
Figure 15A:
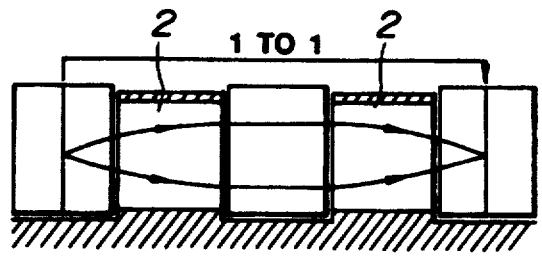
FIGS. 15a through 15f, 16a through 16h, and 17a through 17d are cross-sectional views of motherboards on which various optical/optoelectronic components are mounted.
Figure 15B:
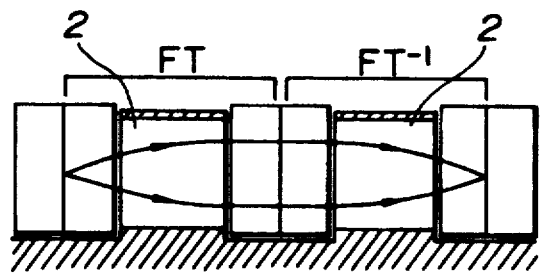
Figure 15C:
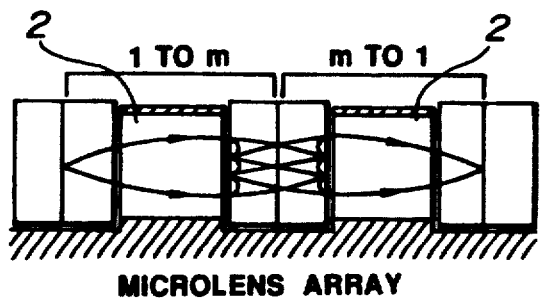
Figure 15D:
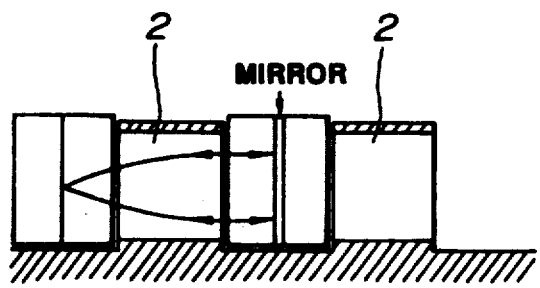
Figure 15E:
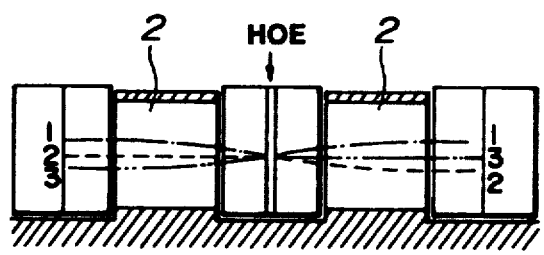
Figure 15F:
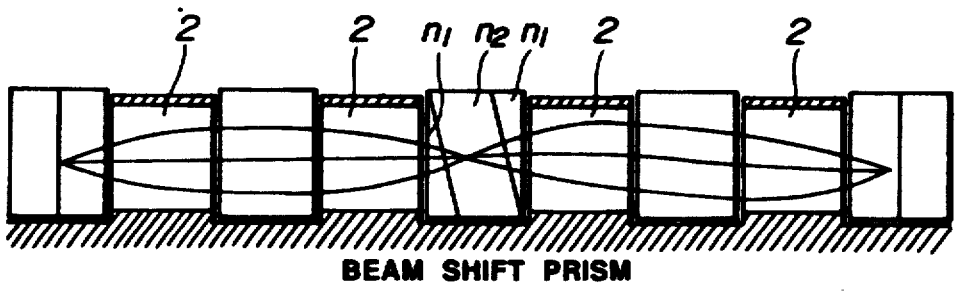
Figure 16A:
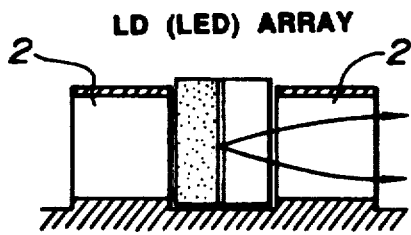
Figure 16B:
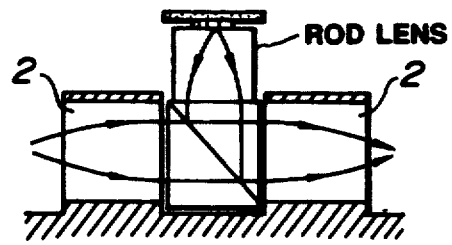
Figure 16C:
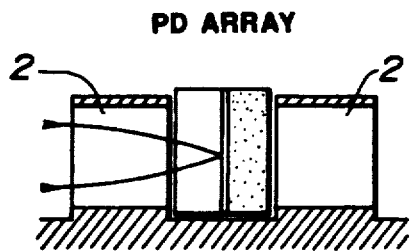
Figure 16D:
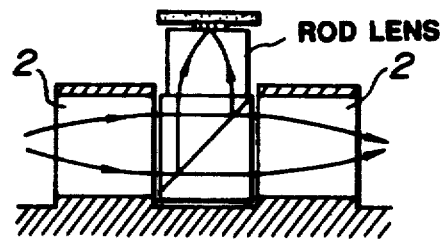
Figure 16E:
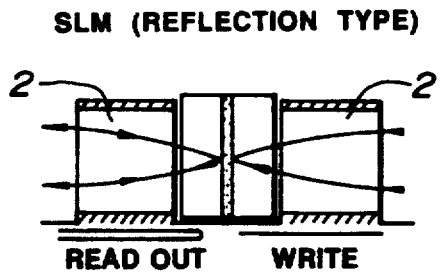
Figure 16F:
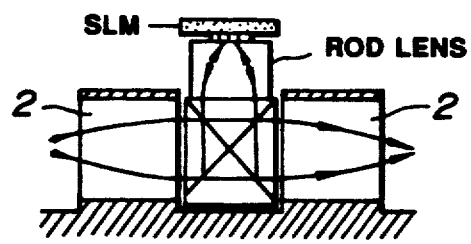
Figure 16G:
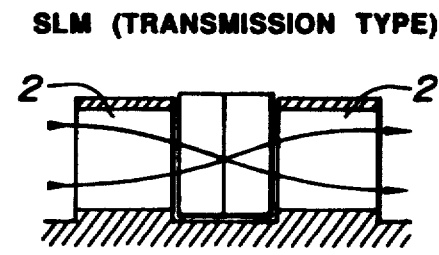
Figure 16H:
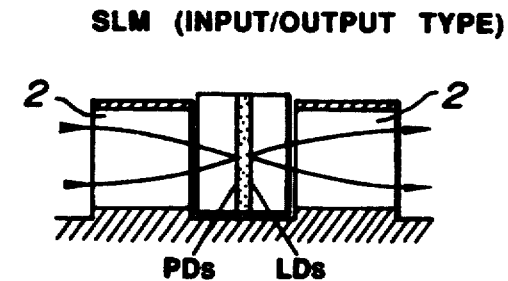

The manner in which an optical/optoelectronic component is inserted in and fixed to the motherboard will be described below with reference to FIGS. 13 and 14.

An optical/optoelectronic unit or component of predetermined configuration is inserted in each gap 20a between the rod lens ends of the motherboard 20, and aligned and fixed in position, using a position reference means on the unit.

The optical/optoelectronic component may comprise an SLM unit in the form of a liquid crystal shutter array (e.g., a liquid crystal panel used in a commercially available liquid crystal television receiver).

The liquid crystal SLM unit, denoted at 81, comprises a pair of glass substrates 82 and a liquid crystal layer 83 sandwiched therebetween. Wires and other parts of the liquid crystal SLM unit 81 are omitted from illustration in FIGS. 13 and 14. The glass substrates 82 have a pair of outer parallel flat surfaces Q, the distance between which determines the thickness of the liquid crystal SLM unit 81.

The glass substrates 82 have a positioning projection 82a on a lower surface thereof. The thickness of the liquid crystal SLM unit 81 is substantially the same as the width of the gap 2B between the confronting rod lens ends, so that the glass substrates 82 are held in contact with the rod lens ends.

Each of the slots 20a in the motherboard 20 shown in FIGS. 4 and 5 has V-shaped recesses 50a defined in its bottom, and the positioning projection 82a of the liquid crystal SLM unit 81 is fitted in one of the V-shaped recesses 50a, thus positioning the liquid crystal SLM unit 81 which is inserted in the slot 20a.

It is assumed that the optical axis of the lens 2 is referred to as a z-axis, and two axes normal to the z-axis are referred to as x- and y-axes, respectively, and that angles of rotation about the x-, y-, and z-axes are referred to as $\theta x$, $\theta y$, and $\theta z$, respectively. When the liquid crystal SLM unit 81 is inserted in the slot between the rod lens ends, the positioning along the z-axis and the swinging angles $\theta x$, $\theta y$ can easily and accurately be determined by the contact between the rod lens ends and the parallel flat surfaces Q of the glass substrates 82, and the positioning along the x- and y-axes and the angle $\theta z$ in the x-y plane can easily and accurately be determined by the fitting engagement between the positioning projection 82a and the V-shaped recess 50a.

Actually, a liquid for matching refractive indexes is interposed between the flat surfaces Q of the glass substrates 82 and the confronting ends of the rod lenses 2, 2', and the liquid crystal SLM unit 81 is positioned in place with a suitable screw or presser after it is inserted.

FIGS. 15a through 15f and 16a through 16h show various optical/optoelectronic components having parallel surfaces and positioning projections.

As shown in FIGS. 15a through 15f and 16a through 16h, the optical/optoelectronic components are of uniform thickness and each have a pair of parallel surfaces and a positioning projection in the same position. These optical/optoelectronic components effectively impart respective functions (e.g., reflection, shuffling, modulation, reception) to an optical pattern that is propagated through the rod lenses 2.

Surfaces of the optical/optoelectronic components which impart their functions (e.g., a surface where a photodetector is positioned, a liquid crystal layer of a liquid crystal SLM unit, etc.) are generally spaced from the parallel surfaces thereof, and are aligned with conjugate focusing planes and Fourier transform planes formed by the rod lenses.

FIGS. 17a through 17d show various specific structures for accurately positioning conjugate focusing planes.

Figure 17A:
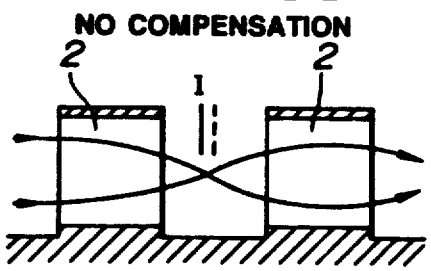
Figure 17B:
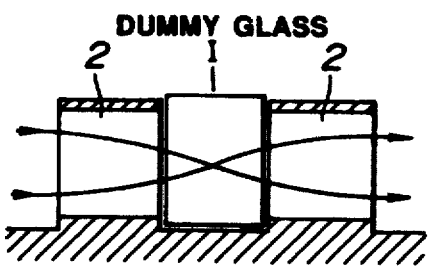
Figure 17C:
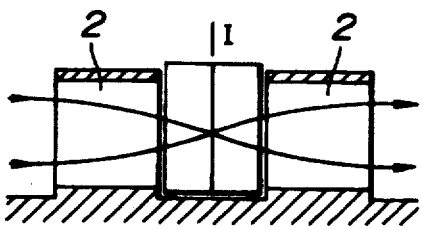
Figure 17D:
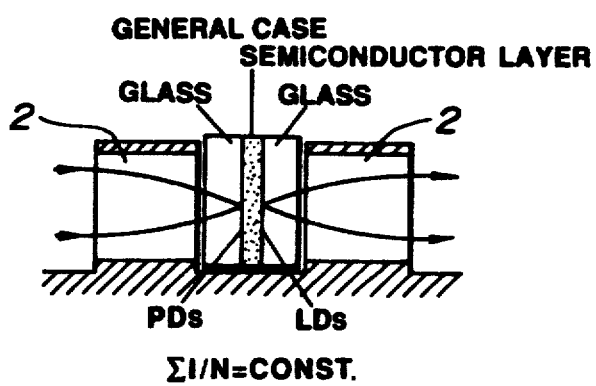

If nothing were inserted between the rod lenses as shown in FIG. 17a, the conjugate focusing plane would be displaced out of position. Even if any particular component is required, a dummy glass plate having a pair of opposite parallel surfaces is inserted between the rod lenses as shown in FIG. 17b. If nontransparent layers or members of different refractive indexes are inserted between opposite parallel surfaces, then a total air-converted length $\Sigma 1/n$ (where 1 is the thicknesses of the members inserted between the parallel surfaces and n is the refractive indexes of the members) is made constant to position the conjugate focusing plane in the members, as shown in FIG. 17d.

The positioning projection 82a and the V-shaped groove 50a may be of any other shape insofar as the inserted component can accurately and easily be positioned in the x-y plane. For example, the inserted component may have a suitable reference pin, and the slot in the mother-board for receiving the component may have a hole or a rectangular recess for receiving the reference pin.

The parallel flat surfaces Q may not necessarily extend over the entire inserted component, but only portions of the surfaces of the inserted component where light is applied to and emitted from the component may lie parallel to each other. The light entrance surface of the component may have three positioning projections that define a flat surface therebetween, and the light exit surface of the component may have three positioning projections that define a flat surface therebetween, these flat surfaces lying parallel to each other.

Although not shown, the substrate 50 of the motherboard and the inserted component may have tapped holes or through holes for screws, and the inserted component may be fastened in position to the substrate 50 by screws inserted in these holes.

The motherboard may only be required to have equally shaped component insertion regions for positioning the components near the conjugate focusing planes using the parallel surfaces and the positioning surface.

Figure 18:
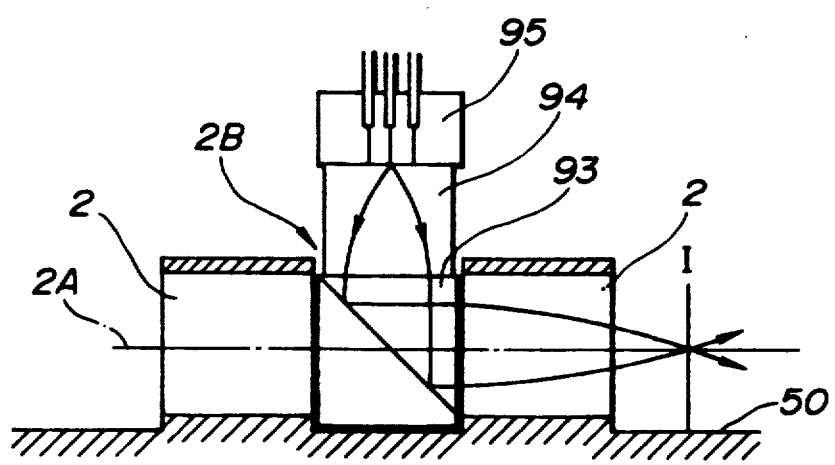
FIG. 18 is a cross-sectional view of an optical input/output port employing optical fibers.

FIG. 18 shows an optical input/output port according to another embodiment of the present invention.

The optical input/output port shown in FIG. 18 has a prism 93, a relay rod lens 94, and an optical fiber array 95 for applying light transmitted over the optical fiber array 95 to the coaxial lens array.

The coaxial lens array comprises rod lenses 2 with the prism 93 inserted in a gap or slot 2B defined between the confronting ends of the rod lenses 2. The rod lens 94 has one flat end joined to one side of the prism 93, and the optical fiber array 95 has one end coupled to the opposite flat end of the rod lens 94.

Divergent light emitted from the optical fiber array 95 is converted by the relay rod lens 94, which has a ¼ pitch length, into parallel light that is reflected by a 45°-inclined reflecting surface of the prism 93 to enter the coaxial lens array.

The image represented by the light from the optical fiber array 95 is focused on a plane I by the rod lens 2 of the coaxial lens array.

The conjugate focusing planes (I1, I2, I3, I4 shown in FIG. 5) of the coaxial lens array are held in optically conjugate relationship to the exit end of the optical fiber array 95.

The optical signal emitted from the optical fiber array 95 can be converted or otherwise processed by a light switch, a light modulator, a light deflector, or the like which is inserted in another gap in the coaxial lens array.

In the case where an array of parallel optical fibers is employed, a microlens array is interposed between the end of the optical fiber array and the coaxial lens array, with the lenses of the microlens array being at the same pitch as that of the optical fibers of the optical fiber array so that the optical fibers and the microlenses confront each other in one-to-one correspondence.

The microlens array should preferably be in the form of a flat microlens array composed of a number of successive lens regions having a greater refractive index than that of the surrounding region, the lens regions being formed by diffusion or the like in one flat plate of glass or plastic.

If the gaps 2B between the rod lens ends are of identical dimensions and the conjugate focusing planes are located in the same positions in the gaps 2B, then components can be inserted and aligned easily in the gaps 2B simply by shaping the outer profiles of the components complementarily to the configurations of the gaps or slots.

The prism 93 is inserted into the slot or gap 2B while being held in contact with the wall surfaces thereof with a liquid interposed therebetween for matching refractive indexes. In this fashion, the prism 93 can easily be aligned and fixed with respect to an optical system such as optical fibers that are highly difficult to achieve optical alignment with the prims.

In FIG. 18, the light emitted from the optical fibers is applied to the coaxial lens array via the prism 93. However, light emitted from the coaxial lens array can also be applied to the optical fiber array via the prism 93.

Arrangements in which an optical signal propagated in one lens array is also propagated in another lens array will be described below with reference to FIGS. 19 and 20.

Figure 19:
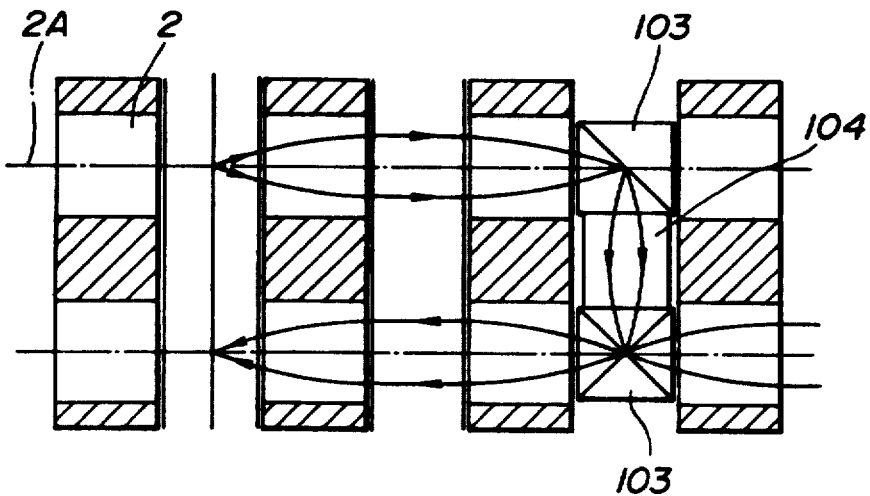
FIG. 19 is a sectional plan view of an arrangement in which an optical signal propagated in one lens array is also propagated in another lens array.
Figure 20:
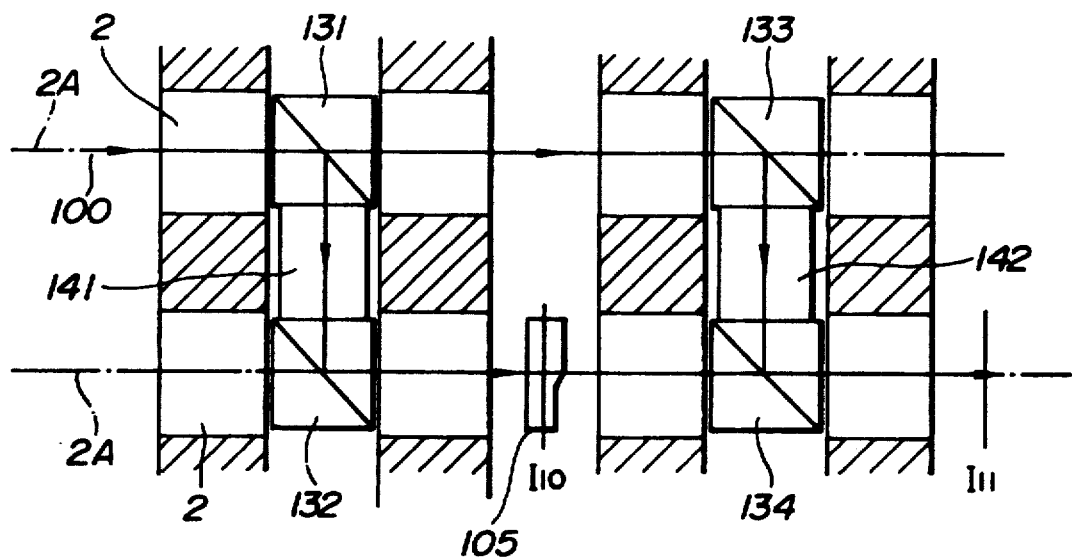
FIG. 20 is a sectional plan view of another arrangement in which an optical signal propagated in one lens array is also propagated in another lens array.
Figure 21:
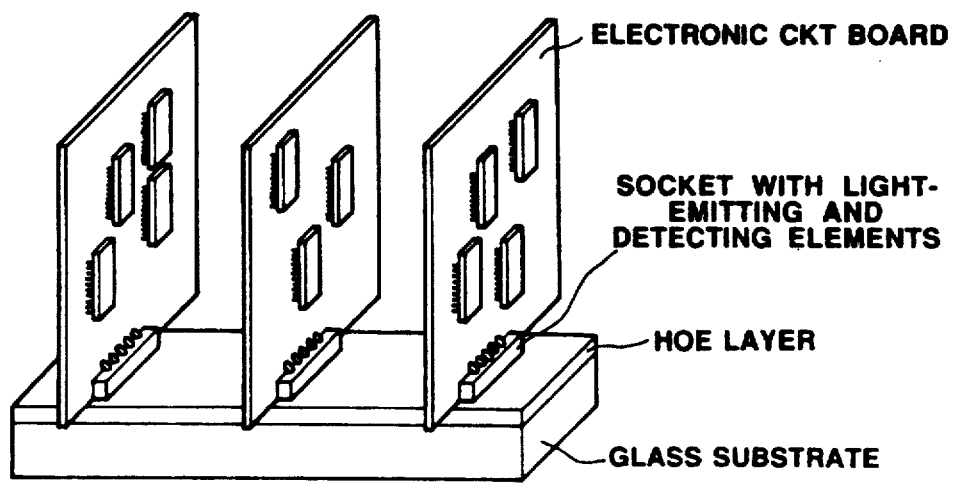
FIG. 21 is a perspective view of a conventional board-to-board interconnection.
Figure 22:
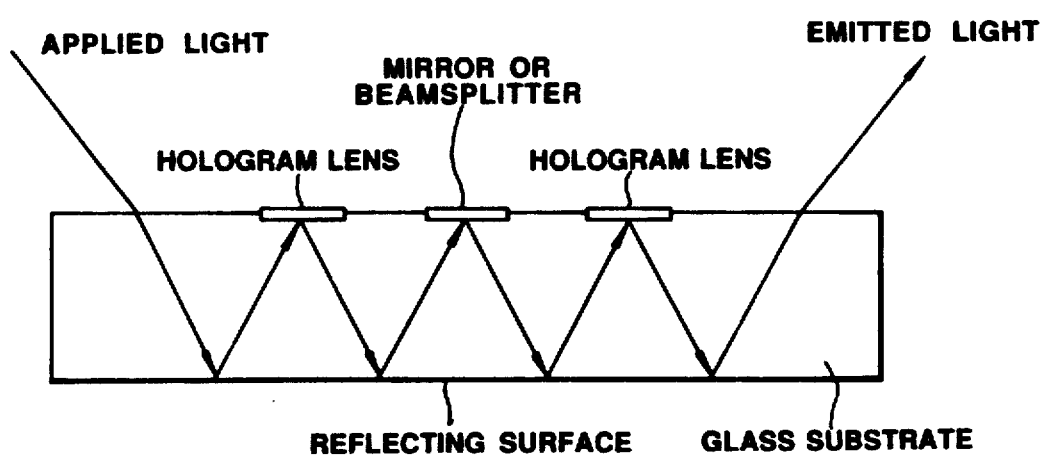
FIG. 22 is an enlarged fragmentary cross-sectional view of the board-to-board interconnection shown in FIG. 21.

In FIGS. 19 and 20, there are a plurality of parallel coaxial lens arrays, and an optical signal propagated in one of the coaxial lens arrays is also propagated in the other coaxial lens array.

In FIG. 19, two adjacent parallel coaxial lens arrays are coupled to each other by two prisms 103 and a rod lens 104 interposed between the two prisms 103.

The optical coupling between the two coaxial lens arrays allows a Mach-Zehnder interferometer to be constructed as shown in FIG. 20.

In FIG. 20, two coaxial lens arrays are optically coupled by four prisms 131 through 134 that are positioned respectively at the corners of a rectangular shape and two rod lenses 141, 142 disposed between the prisms 131, 132 and the prisms 133, 134.

The prisms 131, 134, which are located in light entrance and exit positions, respectively, are in the form of beam splitters, and the other prisms 132, 133 have oblique surfaces that serve as simple reflecting mirrors.

In FIG. 20, a laser beam 100 is applied to one of the lens arrays. When a specimen 105 is placed in an image plane I10, interference fringes corresponding to the optical thickness of the specimen 105 are produced in a conjugate image plane I11 in interference with reference light.

With the above arrangement, parallel coaxial lens arrays in an optical information transmitting device can be optically coupled to each other. Such an optical information transmitting device is effective to provide optical systems for a wide range of applications.

Since a number of parallel conjugate image planes are positioned between rod lenses in the coaxial lens arrays, a plurality of images can easily be arranged in such conjugate image planes when such images are to be added to each other or subtracted from each other.

The prisms 103, 131 through 134, and the specimen 95, and a detector array for detecting interference fringes can easily be inserted and positioned in slots or gaps between the lenses of the coaxial lens arrays by making uniform the relative positions of the conjugate focusing planes and the inner wall surfaces of the slots between the lenses.

As described above, the present invention can provide large-scale, high-density, multichannel parallel optical interconnections between electronic circuit boards.

The electronic circuit boards can produce focused images of high resolution at their input/output ports. The requirements for parallel surfaces of the glass substrate are not as strict as those for the conventional devices. Since the distance over which optical information is required to travel in the optical information transmitting device is not increased, but is reduced to a large extent, a time lag is prevented from occurring between the electronic circuit boards.

The optical/optoelectronic components can be aligned and fixed in position highly accurately. Since these components can be inserted and fixed stably in position by their own outer profiles themselves placed in the slots or gaps, the components remain fixed in position highly reliably after being mounted.

The optical coupling between a plurality of lens arrays allows more complex and practical optical systems to be easily constructed for various applications including optical computing, optical measurement, etc.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

I claim:

1. An optical information transmitting device for transmitting information on a light beam emitted along an optical path by a light source, comprising:
    an electronic circuit board having electronic circuits thereon; and
    an optical input/output port mounted on said electronic circuit board and electrically connected to the electronic circuits, said optical input/output port comprising:
    a glass substrate attached to said electronic circuit board;
    an array of optical sensors for absorbing a portion of a light beam applied thereto from the light source and photoelectrically converting said portion of the light beam, and for transmitting the remainder of the light beam therethrough;
    an array of spatial light modulators for modulating the transmittance with respect to a light beam applied thereto; and
    said arrays of optical sensors and spatial light modulators being disposed on a surface of said glass substrate in superposed relationship to each other along the optical path.

2. An optical information transmitting device according to claim 1, wherein said optical sensors and said optical sensors and said spatial light modulators are disposed in confronting relationship to each other in one-to-one correspondence along the optical path.

3. An optical information transmitting device according to claim 1, wherein said glass substrate has an externally exposed surface coated with an antireflection film.

4. An optical information transmitting device according to claim 1, including a plurality of electronic circuit boards each having said optical input/output port, said electronic circuit boards being arranged such that the array of optical sensors of one of two adjacent optical input/output ports confronts the array of spatial light modulators of the other of the two adjacent optical input/output ports along the optical path.

5. An optical information transmitting device according to claim 2, wherein said glass substrate has an externally exposed surface coated with an antireflection film.

* * * * *

UNITED STATES PATENT AND TRADEMARK OFFICE
CERTIFICATE OF CORRECTION

PATENT NO. : 5,202,567
DATED : Apr. 13, 1993
INVENTOR(S) : Kenjiro Hamanaka

It is certified that error appears in the above-identified patent and that said Letters Patent is hereby corrected as shown below:

At column 6, line 51, delete "to the plane 13" after "13"

At column 9, line 60, "I6" should read --I4--

Signed and Sealed this

Twenty-second Day of August, 1995

Attest:

BRUCE LEHMAN

Attesting Officer

Commissioner of Patents and Trademarks